(12) United States Patent
Youssoufian

(10) Patent No.: US 7,706,496 B2
(45) Date of Patent: Apr. 27, 2010

(54) DIGITAL PHASE DETECTOR FOR A PHASE LOCKED LOOP

(75) Inventor: Edward Youssoufian, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 1395 days.

(21) Appl. No.: 11/048,571

(22) Filed: Jan. 31, 2005

(65) Prior Publication Data

US 2006/0171495 A1 Aug. 3, 2006

(51) Int. Cl.
*H03D 3/24* (2006.01)
*H04L 7/00* (2006.01)

(52) U.S. Cl. ...................... 375/376; 375/354

(58) Field of Classification Search ............... 375/376, 375/373, 371, 354; 327/141; 358/409; 370/503; 713/400; 714/12
See application file for complete search history.

(56) References Cited

U.S. PATENT DOCUMENTS

| | | | | |
|---|---|---|---|---|
| 5,459,755 | A | * | 10/1995 | Iga et al. ................. 375/376 |
| 6,104,250 | A | * | 8/2000 | Eckersten et al. ............. 331/2 |
| 6,157,218 | A | | 12/2000 | Chen |
| 6,256,362 | B1 | * | 7/2001 | Goldman .................. 375/373 |
| 6,326,851 | B1 | * | 12/2001 | Staszewski et al. ........... 331/17 |
| 6,377,093 | B1 | | 4/2002 | Lee |
| 6,429,693 | B1 | | 8/2002 | Staszewski et al. |
| 6,757,349 | B1 | * | 6/2004 | Katayama et al. ........... 375/376 |
| 2003/0169086 | A1 | * | 9/2003 | Lee et al. ................. 327/158 |
| 2003/0235262 | A1 | * | 12/2003 | Staszewski et al. .......... 375/376 |
| 2004/0266376 | A1 | | 12/2004 | Cowley et al. |

OTHER PUBLICATIONS

Staszewski et al, *Just-in-time Gain Estimation of an RF Digitally-Controlled Oscillator for Digital Direct Frequency Modulation*, 50 IEEE Transactions on Circuits and Systems, 887-892 (2003).
Lee, et al, *A 1.5V 28mA Fully-Integrated Fast-Locking Quad-Band GSM-GPRS Transmitter with Digital Auto-Calibration in 130nm CMOS*, §10.4, IEEE ISSCC (2004).

(Continued)

*Primary Examiner*—David C Payne
*Assistant Examiner*—Brian J Stevens

(57) ABSTRACT

According to one exemplary embodiment, a digital phase detector includes a phase/frequency detector, where the phase/frequency detector is configured to receive a reference signal and a divided oscillator feedback signal and output a first pulse-width modulated signal and a second pulse-width modulated signal. The digital phase detector also includes a first time-to-digital converter, where the first time-to-digital converter is coupled to the phase/frequency detector. The first time-to-digital converter is configured to receive and convert the first pulse-width modulated signal to a first digital number. The digital phase detector further includes a second time-to-digital converter coupled to the phase/frequency detector and configured to receive and convert the second pulse-width modulated signal to a second digital number. The digital phase detector further includes a summation element, where the summation element is configured to subtract the second digital number from the first digital number and output a digital phase error signal.

16 Claims, 2 Drawing Sheets

OTHER PUBLICATIONS

McMahill, et al, *A 2.5 MB/s GFSK 5.0Mb/s 4-FSK Automatically calibrated Sigma Delta Frequency synthesizer*, 37 IEEE Journal of Solid State Circuits, (Jan. 2002).

Staszewski et al, *All-Digital Phase Domain TX Frequency Synthesizer for Bluetooth Radios in 0.13um CMOS*, §15.3, IEEE ISSCC (2004).

Staszewski et al, *All-Digital TX Frequency Synthesizer and Discrete-Time Receiver for Bluetooth Radios in 130-nm CMOS*, 39 IEEE Journal of Solid State Circuits, 2278-2291 (Dec. 2004).

Baker, R. Jacob, *CMOS Dircuit Design, Layout, and Simulation, Second Edition*, Wiley-Interscience, IEEE, 576-577 (2005).

\* cited by examiner

DIGITAL PHASE DETECTOR FOR A PHASE LOCKED LOOP

BACKGROUND OF THE INVENTION

1. Field of the Invention

The present invention is generally in the field of electrical circuits. More particularly, the invention is in the field of phase locked loops.

2. Related Art

Phase locked loops are often used as frequency synthesizers in applications, such as communication systems, that require a precise signal frequency. The typical components of a phase locked loop include a phase detector, a frequency-controllable oscillator, and a loop filter. Phase detectors, such as a charge pump phase detector and a sample-and-hold phase detector, are commonly implemented using analog circuitry. However analog phase detectors suffer from the traditional limitations of analog circuitry, such as variation with process, temperature dependence, sensitivity to substrate coupling, and limitations caused by parasitics.

Various approaches to digital phase detection have been attempted to overcome the above limitations of phase detectors that use analog circuitry. However, conventional digital phase detectors often require multi-Gigahertz clocks or other types of circuit blocks that are undesirable.

Thus, there is a need in the art for a digital phase detector for a phase locked loop that overcomes the deficiencies of conventional phase detectors.

SUMMARY OF THE INVENTION

The present invention is directed to a digital phase detector for a phase locked loop. The present invention resolves the need in the art for a digital phase detector for a phase locked loop that overcomes the deficiencies of conventional phase detectors.

According to one exemplary embodiment, a digital phase detector includes a phase/frequency detector, where the phase/frequency detector is configured to receive a reference signal and a divided oscillator feedback signal and output a first pulse-width modulated signal and a second pulse-width modulated signal. The first pulse-width modulated signal can indicate that a phase of the divided oscillator feedback signal leads a phase of the reference signal, for example. The second pulse-width modulated signal can indicate that a phase of the divided oscillator feedback signal lags a phase of the reference signal, for example. An output of the digital phase detector can control a frequency of an output signal of a digitally controlled oscillator, for example. The digital phase detector also includes a first time-to-digital converter, where the first time-to-digital converter is coupled to the phase/frequency detector. The first time-to-digital converter is configured to receive and convert the first pulse-width modulated signal to a first digital number.

According to this exemplary embodiment, the digital phase detector further includes a second time-to-digital converter coupled to the phase/frequency detector, where the second time-to-digital converter is configured to receive and convert the second pulse-width modulated signal to a second digital number. The digital phase detector further includes a summation element, where the summation element is configured to subtract the second digital number from the first digital number and output a digital phase error signal. A difference between the first digital number and the second digital number is proportional to a phase difference between the reference signal and the divided oscillator feedback signal. Other features and advantages of the present invention will become more readily apparent to those of ordinary skill in the art after reviewing the following detailed description and accompanying drawings.

DETAILED DESCRIPTION OF THE INVENTION

The present invention is directed to a digital phase detector for a phase locked loop. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention provides an innovative digital phase detector for a phase locked loop, such as a digital phase locked loop. Although a phase locked loop including a digitally controlled oscillator is utilized in the present embodiment to illustrate the invention, the present invention's digital phase detector can also be used in phase locked loops that comprise other types of oscillators, such as voltage controlled oscillators.

Figure 1:
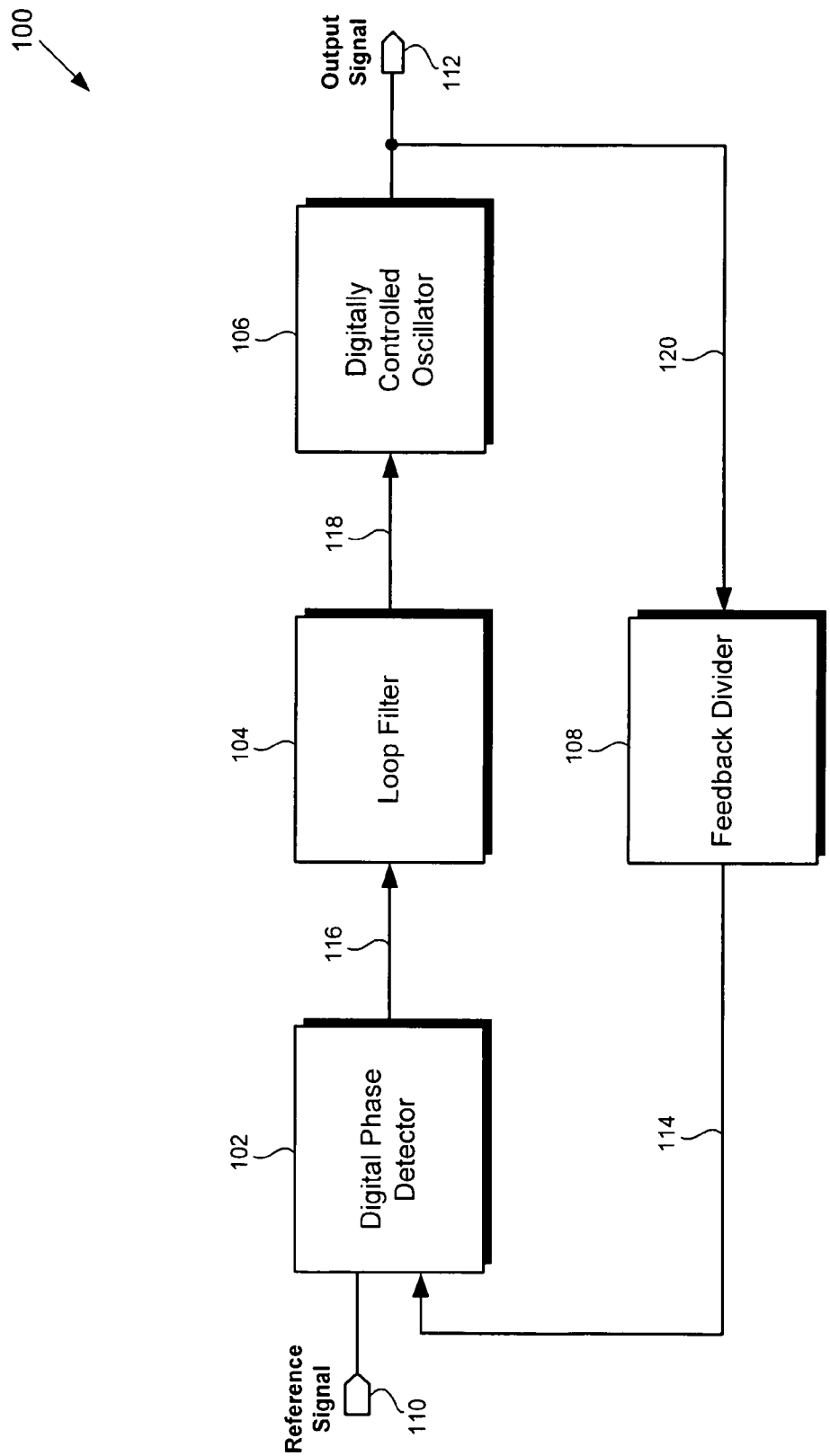
FIG. 1 is a block diagram of an exemplary phase locked loop including an exemplary digital phase detector in accordance with one embodiment of the present invention.

FIG. 1 shows a block diagram of an exemplary phase locked loop including an exemplary digital phase detector in accordance with one embodiment of the present invention. Certain details and features have been left out of FIG. 1 that are apparent to a person of ordinary skill in the art. Phase locked loop 100 includes digital phase detector 102, loop filter 104, digitally controlled oscillator 106, and feedback divider 108. Phase locked loop 100 can be an all-digital phase locked loop. In one embodiment, phase locked loop 100 can be a phase locked loop comprising one or more digital components, such as digital phase detector 102. Phase locked loop 100 can be configured to receive reference signal 110 and provide output signal 112, which is phase locked to reference signal 110.

As shown in FIG. 1, reference signal 110, which can be a digital reference signal, is coupled to one input of digital phase detector 102, and a divided oscillator output signal, which is outputted by feedback divider 108, is coupled to another input of digital phase detector 102 via line 114. Digital phase detector 102 comprises a phase/frequency detector (not shown in FIG. 1) coupled to two time-to-digital converters (not shown in FIG. 1). Digital phase detector 102 can be configured to receive reference signal 110 at one input and receive a divided oscillator output signal outputted by feedback divider 108 at another input and output a digital phase error signal online 116.

The digital phase error signal outputted by digital phase detector 102, which corresponds to a difference in phase between reference signal 110 and the divided oscillator output signal outputted by feedback divider 108, is a digital number that is used to control the frequency of digitally controlled oscillator 106. By utilizing a phase/frequency detector and time-to-digital converters to form digital phase detector 102, the present invention provides a digital phase detector that advantageously avoids analog charge pumps, an analog filter, and analog control signals and is easy to implement. The present invention's digital phase detector will be discussed below in relation to FIG. 2.

Also shown in FIG. 1, the output of digital phase detector 102 is coupled to the input of loop filter 104 via line 116. Loop filter 104 can be a digital loop filter, which can be an elliptical filter, and can be configured to receive the digital phase error signal outputted by digital phase detector 102, appropriately filter the digital phase error signal, and provide a digital tuning control signal on line 118. An elliptical filter provides a sharp roll-off, which advantageously increases noise attenuation and allows a wider bandwidth. Also, in contrast to an analog loop filter, a digital loop filter will not vary significantly with process or temperature and that has a filter area (on a semiconductor die) that will advantageously scale with technology.

Further shown in FIG. 1, the output of loop filter 104 is coupled to the input of digitally controlled oscillator 106 via line 118. Digitally controlled oscillator 106 can be configured to receive a digital tuning control signal outputted on line 118 by loop filter 104, utilize the digital tuning control signal to appropriately adjust oscillator frequency, and provide output signal 112, which is phase locked to reference signal 110. Also shown in FIG. 1, output signal 112, which is outputted by digitally controlled oscillator 106, is coupled to the input of feedback divider 108 via line 120. Feedback divider 108 can be configured to receive output signal 112 on line 120, divide output signal 112 by an appropriate integer value in a manner known in the art, and output a divided oscillator feedback signal to digital phase detector 102 on line 114.

Figure 2:
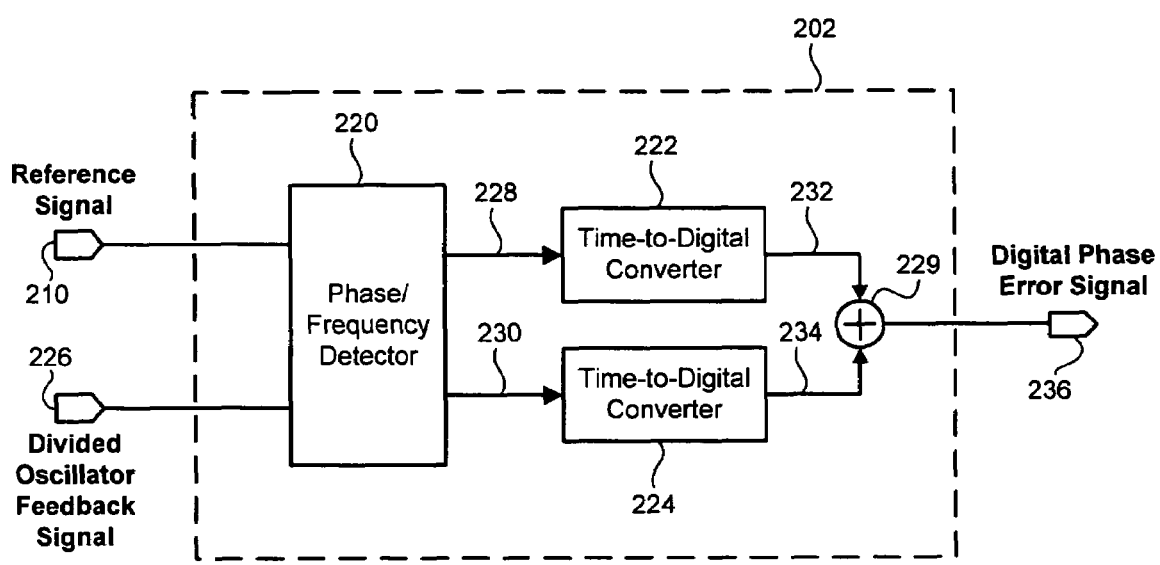
FIG. 2 illustrates a block diagram of an exemplary digital phase detector in accordance with one embodiment of the present invention.

FIG. 2 shows a block diagram of an exemplary digital phase detector in accordance with one embodiment of the present invention. Digital phase detector 202 and reference signal 210 in FIG. 2 correspond, respectively, to digital phase detector 102 and reference signal 110 in phase locked loop 100 in FIG. 1. Digital phase detector 202 comprises phase/frequency detector 220, time-to-digital converters 222 and 224, and summation element 229. Phase/frequency detector 220 can be configured to receive reference signal 210 at one input and divided oscillator feedback signal 226, which is outputted by feedback divider 108 in FIG. 1, at another input and compare the phase of reference signal 210 with the phase of divided oscillator feedback signal 226.

Phase/frequency detector 220 can be further configured to output a pulse-width modulated up signal on line 228 when the phase of divided oscillator feedback signal 226 is leading the phase of reference signal 210 and to output a pulse-width modulated down signal when the phase of divided oscillator output signal 226 is lagging the phase of reference signal 210. The difference between the pulse-width modulated up signal and the pulse-width modulated down signal is proportional to the phase difference between reference signal 210 and divided oscillator feedback signal 226. As shown in FIG. 2, phase/frequency detector 220 is coupled to time-to-digital converter 222 and time-to-digital converter 224 via respective lines 228 and 230.

Time-to-digital converter 222 can be configured to receive and convert the pulse-width modulated up signal outputted by phase/frequency detector 220 to a digital number, and output the digital number on line 232. Similarly, time-to-digital converter 224 can be configured to receive and convert the pulse-width modulated down signal outputted by phase/frequency detector 220 to a digital number, and output the digital number on line 234. Also shown in FIG. 2, time-to-digital converter 222 and time-to-digital converter 224 are coupled to summation element 229 via respective lines 232 and 234. Summation element 229 can be configured to subtract the digital number on line 234, which corresponds to the pulse-width modulated down signal, from the digital number on line 232, which corresponds to the pulse-width modulated up signal, and output digital phase error signal 236, which is a digital representation of the phase difference between reference signal 210 and divided oscillator feedback signal 226.

The operation of digital phase detector will now be discussed. Reference signal 210 and divided oscillator feedback signal 226, which is a signal that has been outputted by digitally controlled oscillator 106 in FIG. 1 and appropriately divided by feedback divider 108, are inputted into phase/frequency detector 220. Phase/frequency detector 220 compares the phase of reference signal 210 to the phase of divided oscillator feedback signal 226 and outputs pulse-width modulated up and down signals on respective lines 228 and 230. Time-to-digital converter 222 converts the pulse width of the pulse-width modulated up signal into a digital number, which is inputted into summation element 229, while time-to-digital converter 224 similarly converts the pulse width of the pulse-width modulated down signal into a digital number, which is also inputted into summation element 229.

In summation element 229, the digital number received from time-to-digital converter 224 is subtracted from the digital number received from time-to-digital converter 222 and the difference between the two digital numbers is outputted as digital phase error signal 236, which is a digital number that is proportional to the phase difference between reference signal 210 and divided oscillator feedback signal 226. Digital phase error signal 236 is utilized to control the frequency of output signal 112, which is outputted by digitally controlled oscillator 106.

Thus, as discussed above, the present invention combines a phase/frequency detector and time-to-digital converters to advantageously achieve a digital phase detector. As a result, the present invention achieves a digital phase detector that advantageously avoids undesirable conventional analog charge pumps, filters, and control signals and is easy to implement.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, digital phase detector for a phase locked loop has been described.

The invention claimed is:

1. A digital phase detector comprising:
   a phase/frequency detector, said phase/frequency detector being configured to receive a reference signal and a divided oscillator feedback signal and output a first pulse-width modulated signal and a second pulse-width modulated signal;
a first time-to-digital converter, said first time-to-digital converter being coupled to an output of said phase/frequency detector;
wherein said first time-to-digital converter is configured to receive and convert said first pulse-width modulated signal to a first digital number;
a second time-to-digital converter coupled to an output of said phase/frequency detector, wherein said second time-to-digital converter is configured to receive and convert said second pulse-width modulated signal to a second digital number; and
a summation element, wherein said summation element is configured to subtract said second digital number from said first digital number and output a digital phase error signal.

2. The digital phase detector of claim 1 wherein said first digital number corresponds to a change in phase between said reference signal and said divided oscillator feedback signal.

3. The digital phase detector of claim 1 wherein a difference between said first digital number and said second digital number is proportional to a phase difference between said reference signal and said divided oscillator feedback signal.

4. The digital phase detector of claim 1 wherein said first pulse-width modulated signal indicates that a phase of said divided oscillator feedback signal leads a phase of said reference signal.

5. The digital phase detector of claim 1 wherein said second pulse-width modulated signal indicates that a phase of said divided oscillator feedback signal lags a phase of said reference signal.

6. The digital phase detector of claim 1 wherein an output of said digital phase detector controls a frequency of an output signal of a digitally controlled oscillator.

7. The digital phase detector of claim 6 wherein a digital loop filter couples said output of said digital phase detector to said digitally controlled oscillator.

8. The digital phase detector of claim 7 wherein said digital loop filter is an elliptic filter.

9. A phase locked loop comprising:
a digital phase detector, said digital phase detector being configured to receive a reference signal and a divided oscillator feedback signal and to output a digital phase error signal;
said digital phase detector comprising a phase/frequency detector coupled to a first time-to-digital converter, said phase/frequency detector being configured to receive said reference signal and said divided oscillator feedback signal and to output a first pulse-width modulated signal and a second pulse-width modulated signal, said first time-to-digital converter being configured to receive said first pulse-width modulated signal from said phase/frequency detector and convert said first pulse-width modulated signal to a first digital number;
wherein said first digital number corresponds to a change in phase between said reference signal and said divided oscillator feedback signal;
a second time-to-digital converter coupled to said phase/frequency detector, wherein said second time-to-digital converter is configured to receive said second pulse-width modulated signal from said phase/frequency detector and convert said second pulse-width modulated signal to a second digital number; and
a summation element, wherein said summation element is configured to subtract said second digital number from said first digital number and output said digital phase error signal.

10. The phase locked loop of claim 9 wherein said digital phase error signal corresponds to a phase difference between said reference signal and said divided oscillator feedback signal.

11. The phase locked loop of claim 9 wherein said first pulse-width modulated signal indicates that a phase of said divided oscillator feedback signal leads a phase of said reference signal.

12. The phase locked loop of claim 9 wherein said second pulse-width modulated signal indicates that a phase of said divided oscillator feedback signal lags a phase of said reference signal.

13. The phase locked loop of claim 9 further comprising a digital loop filter coupled to said digital phase detector, wherein said digital loop filter is configured to receive said digital phase error signal and to output a digital tuning control signal.

14. The phase locked loop of claim 13 wherein said digital loop filter comprises an elliptic filter.

15. The phase locked loop of claim 13 further comprising a digitally controlled oscillator coupled to said digital loop filter, wherein said digital tuning control signal controls a frequency of an output signal of said digitally controlled oscillator.

16. The phase locked loop of claim 15 further comprising a feedback divider, wherein said feedback divider is configured to receive said output signal of said digitally controlled oscillator and to output said divided oscillator feedback signal.

* * * * *